(12) United States Patent
Stricker et al.

(10) Patent No.: US 7,732,013 B2
(45) Date of Patent: Jun. 8, 2010

(54) METHOD OF FORMING A ZINC OXIDE COATED ARTICLE

(75) Inventors: Jeffery L. Stricker, Narberth, PA (US); Michael B. Abrams, Bala Cynwyd, PA (US); Roman Y. Korotkov, King of Prussia, PA (US); Gary S. Silverman, Chadds Ford, PA (US); Ryan C. Smith, Collegeville, PA (US)

(73) Assignees: Pilkington Group Limited, St. Helens, Merseyside (GB); Arkema, Inc., King of Prussia, PA (US)

( * ) Notice: Subject to any disclaimer, the term of this patent is extended or adjusted under 35 U.S.C. 154(b) by 90 days.

(21) Appl. No.: 11/800,043

(22) Filed: May 3, 2007

(65) Prior Publication Data

US 2008/0057200 A1    Mar. 6, 2008

Related U.S. Application Data

(60) Provisional application No. 60/840,914, filed on Aug. 29, 2006.

(51) Int. Cl.
*C23C 16/06* (2006.01)
(52) U.S. Cl. .............. 427/255.33; 427/255.19; 427/64; 427/166
(58) Field of Classification Search .............. 427/248.1, 427/255.31, 255.33, 255.19, 64, 166
See application file for complete search history.

(56) References Cited

U.S. PATENT DOCUMENTS

| 4,751,149 A | * | 6/1988 | Vijayakumar et al. ....... 428/702 |
| 5,698,262 A | | 12/1997 | Soubeyrand et al. |
| 6,238,738 B1 | * | 5/2001 | McCurdy ............... 427/255.19 |

OTHER PUBLICATIONS

Hu et al. (Textured Fluorine-Doped ZnO films by Atmospheric CVD, Solar Cells, Elsevier, vol. 30, No. ¼ (1991), pp. 437-450).*
Jeffrey et al. (Chemical Vapor Deposition Polymerization: published by Springer, 2003, pp. 14-15).*
Hu, J., et al., "Textured Fluorine-Doped ZnO Films by Atmospheric Chemical Vapor Deposition and Their Use in Amorphous Silicon Solar Cells", Solar Cells, Elsevier (Sequoia, S.A.) vol. 30. No. ¼ (1991), pp. 437-450.

* cited by examiner

*Primary Examiner*—Duy-Vu N. Deo
*Assistant Examiner*—Mahmoud Dahimene
(74) *Attorney, Agent, or Firm*—Marshall & Melhorn, LLC

(57) ABSTRACT

The invention described and claimed herein relates to a chemical vapor deposition process for depositing a zinc oxide coating on a substrate by delivering two gaseous precursor streams to a surface of the substrate, and mixing the gaseous precursor streams at the substrate surface for a time sufficiently short so as to form a zinc oxide coating at a deposition rate greater than 5 nm/second.

11 Claims, No Drawings

METHOD OF FORMING A ZINC OXIDE COATED ARTICLE

RELATED APPLICATION

This application is claiming the benefit, under 35 U.S.C. 119(e), of the provisional application filed Aug. 29, 2006 under 35 U.S.C. 111(b), which was granted Ser. No. 60/840,914. This provisional application is hereby incorporated by reference.

BACKGROUND

The present invention is related to a method of depositing a zinc oxide coating on a transparent substrate; more particularly, it is related to a chemical vapor deposition method of depositing a zinc oxide coating on a glass substrate.

Deposition of metal oxide coatings reacted with $H_2O$ has been reported in the patent literature. For example:

U.S. Pat. No. 4,751,149 describes a chemical vapor deposition (CVD) process for depositing zinc oxide films having certain properties which make them useful in photoconductive applications, such as in solar cells, and other photovoltaic devices. The deposition process includes introducing an organozinc compound, an oxidant and an inert carrier gas into a chamber containing a substrate heated to a temperature in the range of about 60° C. to 350° C. The resulting zinc oxide films are said to have a resistivity in the range of about $10^{-4}$ to $10^{-2}$ ohm centimeter. Such films contain hydrogen and may be fabricated to contain a Group III element by introducing volatile Group III compounds into the chamber along with the organozinc compound and oxidant.

U.S. Pat. No. 5,698,262 describes a method for making doped tin oxide coatings utilizing a uniform, vaporized reactant mixture containing an organotin compound, hydrofluoric acid, water and oxygen, and delivering the reactant mixture to a surface of a hot ribbon of glass, where the above-mentioned compounds react to form the fluorine doped tin oxide coating. The fluorine doped tin oxide coatings deposited in accordance with the invention exhibit lower sheet resistance and improved uniformity in sheet resistance over the coated surface of the glass substrate.

It would be desirable to be able to make zinc oxide films at high deposition rates by atmospheric pressure chemical vapor deposition during the float glass manufacturing process, utilizing relatively inexpensive precursor materials.

SUMMARY OF THE INVENTION

The present invention provides an atmospheric pressure chemical vapor deposition method for depositing a zinc oxide coating on a hot glass substrate comprising first and second precursor gas streams, the gas streams comprising a zinc containing compound, and water, respectively. The first and second gas streams are mixed in a controllable manner and are brought into contact with the surface of the hot glass substrate, which surface is at a temperature sufficient to drive a reaction between the zinc containing compound and the water. The mixing time of the first and second precursor gas streams is controlled to be sufficiently short that a zinc oxide coating is formed on the glass surface at a deposition rate of greater than 5 nm/second.

DETAILED DESCRIPTION OF THE INVENTION

While zinc oxide coatings and deposition methods are known, cost effective methods of making pyrolytic zinc oxide coatings, at commercially viable growth rates, during the glass making process on a float glass manufacturing line, have not previously been known. The present invention overcomes the previous obstacles of making such zinc oxide films at commercially viable growth rates.

While any suitable method of atmospheric pressure chemical vapor deposition may be utilized in connection with the present invention, the method of deposition disclosed in U.S. Pat. No. 6,268,019 to Atofina Chemicals, Inc. is preferred. The '019 patent is incorporated herein by reference, in its entirety. The method of the '019 patent has been shown to be capable of depositing metal oxide films of various kinds, at commercially useful growth rates, for example, at greater than 5 nm/sec. The precursor gases are delivered to a gas mixing chamber a predetermined distance above a surface of the substrate. The precursor gases are mixed together in the gas mixing chamber to form a precursor mixture which, upon exiting the gas mixing chamber, contacts the surface of the substrate as it moves outside of and past the gas mixing chamber. The deposition method of the '019 patent also has the advantage of being able to vary the mixing time of the reactant materials which, in turn, allows "tuning" of the properties of, in this instance, zinc oxide coatings. In particular, the present invention demonstrates the benefits of utilizing water to enhance the growth rates of zinc oxide films, which benefits will be discussed in greater detail herein.

Such zinc oxide coated glass products are useful as low emissivity and/or solar control layers in architectural window applications. Other potential applications of this transparent conducting oxide include: photovoltaic devices, solid-state lighting (LEDs and OLEDs), induction heating, flat panel displays and touch panel screens, and transparent thin film transistors (TFT) that have applications in RFID tags and integrated circuits.

Suitable zinc containing compounds include, but are not limited to, compounds meeting the general formula $R^1R^2Zn$ or $R^1R^2Zn—[R^3R^4N(CHR^5)_n(CH_2)_m(CHR^6)_nNR^7R^8]$, where $R^{1-8}$ can be the same or different alkyl or aryl groups such as methyl, ethyl, isopropyl, n-propyl, n-butyl, sec-butyl, phenyl or substituted phenyl, and may include one or more fluorine-containing substituents, $R^5$ and $R^6$ can be H or alkyl or aryl groups, n can be 0 or 1, and m can be 1-6 if n is 0, and m can be 0-6 if n is 1.

Suitable oxygen containing compounds include, but are not limited to: organic acetates, alcohols, molecular oxygen, and water ($H_2O$), with $H_2O$ or alcohols containing controlled amounts of water being preferred.

An inert carrier gas, such as nitrogen, helium, or the like may also be utilized as a component of the gaseous reactant stream of the present invention.

Temperatures found to be suitable to allow the desired chemical reactions to take place are $\geq 400°$ C., in particular, 500° C.-700° C.

Suitable mixing times for the chemical precursor streams of the invention have been found to be <1 second, preferably less than 0.5 seconds, and more preferably in the range of 70-100 msec.

Suitable glass substrates are preferably made by the well known float glass process, such as is described in, for example, U.S. Pat. Nos. 3,356,474, 3,433,612, 3,531,274, and 3,790,361, each of which is incorporated herein by reference.

EXAMPLES

The following non-limiting examples illustrate certain aspects of the present invention.

The APCVD apparatus used in these experiments is similar to that described in U.S. Pat. No. 6,268,019 B1. A key feature of the apparatus is the ability to control the mixing time of the gaseous reagents by feeding the vapors separately to the coating nozzle. In Comparative Example 1 and Example 1 below, the coating nozzle consisted of concentric tubes—a ¼" secondary tube fed into a ⅝" primary tube via compression fitting that allows the length of the mixing zone to be adjusted, and an outer ~1" tube connected to an exhaust blower for removal of by-products and unreacted vapors. The films resulting from this nozzle configuration were circular with a diameter of approximately ¾". In Comparative Example 2 and Examples 2-7 below, the coating nozzle consisted of concentric tubes –¼" secondary tube fed into a ¾" primary tube via a compression fitting that allows the length of the mixing zone to be adjusted, and an outer ~1.25" tube connected to an exhaust blower for removal of by-products and unreacted vapors. The films resulting from this nozzle configuration were circular with diameter approximately ⅞".

Comparative Example 1

A gas mixture of 0.034 mol % $Et_2Zn.TEEDA$ [TEEDA=N,N,N',N'-tetraethyl ethylenediamine] in 7.5 slpm of nitrogen carrier gas was fed into the primary feed tube at a temperature of 170° C. In the secondary feed tube, a gas mixture of 0.60 mol % ultra high purity $O_2$ in 5 slpm nitrogen was fed at a temperature 170° C. The secondary nozzle was inserted to allow for a mixing zone length of 23 cm, corresponding to a mixing time of ~114 msec between the primary and secondary feed streams. The substrate used for deposition was soda-lime-silicate float glass with a thickness of 2.5 mm. The substrate was heated on a resistively heated nickel block set at 675° C. The substrate temperature was recorded as 650° C. by an infrared pyrometer. The deposition time for the films was 500 seconds, and the resulting ZnO film had a thickness of 297 nm for a deposition rate of 0.6 nm/s. The haze for these films averaged 0.84% as measured by a BYK HazeGuard Plus hazemeter.

Example 1

A gas mixture of 0.096% $Et_2Zn.TEEDA$ in 12 slpm of nitrogen carrier gas was fed into the primary feed tube at a temperature of 160° C. In the secondary feed tube, a gas mixture of 6.92 mol % water in 3 slpm nitrogen was fed at a temperature of 160° C. The secondary nozzle was inserted to allow for a mixing zone length of 18 cm, corresponding to a mixing time of ~76 msec between the primary and secondary feed streams. The substrate used for deposition was borosilicate float glass with a thickness of 1.1 mm. The substrate was heated on a resistively heated nickel block set at 675° C. The substrate temperature was recorded as 650° C. by an infrared pyrometer. The deposition time for the films was 60 seconds, and the resulting ZnO films had a thickness of 531 nm, for a deposition rate of 8.8 nm/s. The haze for these films averaged 2.65% as measured by a BYK HazeGuard Plus hazemeter.

Example 2

A gas mixture of 1.04 mol % $Et_2Zn.TEEDA$ in 15 sLpm of nitrogen carrier gas was fed into the primary feed tube at a temperature of 170° C. In the secondary feed tube, a gas mixture of 8.30 mol % water in 5 slpm nitrogen was fed at a temperature of 170° C. The secondary nozzle was inserted to allow for a mixing zone length of 81 cm, corresponding to a mixing time of ~71 msec between the primary and secondary feed streams. The substrate used for deposition was borosilicate float glass with a thickness of 1.1 mm. The substrate was heated on a resistively heated nickel block set at 675° C. The substrate temperature was recorded as 650° C. by an infrared pyrometer. The deposition time for the films was 3 seconds, and the resulting ZnO films had a thickness of 287 nm for a deposition rate of 95.7 nm/s. The haze for these films averaged 4.0% as measured by a BYK HazeGuard Plus hazemeter.

Comparative Example 2

A gas mixture of 0.096% $Et_2Zn.TEEDA$ in 12 slpm of nitrogen carrier gas was fed into the primary feed tube at a temperature of 160° C. In the secondary feed tube, a gas mixture of 3.46 mol % water in 3 slpm nitrogen was fed at a temperature of 160° C. The secondary nozzle was inserted to allow for a mixing zone length of 18 cm, corresponding to a mixing time of ~400 msec between the primary and secondary feed streams. The substrate used for deposition was borosilicate float glass with a thickness of 1.1 mm. The substrate was heated on a resistively-heated nickel block set at 675° C. The substrate temperature was recorded as 650° C. by an infrared pyrometer. The deposition time for the films was 60 seconds, and no film was deposited onto the substrate under these conditions.

Example 3

A gas mixture of 0.29% $Et_2Zn.TEEDA$ in 12 slpm of nitrogen carrier gas was fed into the primary feed tube at a temperature of 160° C. In the secondary feed tube, a gas mixture of 0.58 mol % water in 3 slpm nitrogen was fed at a temperature of 160° C. The secondary nozzle was inserted to allow for a mixing zone length of 18 cm, corresponding to a mixing time of ~76 msec between the primary and secondary feed streams. The substrate used for deposition was borosilicate float glass with a thickness of 1.1 mm. The substrate was heated on a resistively heated nickel block set at 525° C. The substrate temperature was recorded as 500° C. by an infrared pyrometer. The deposition time for the films was 20 seconds, and the film thickness was 467 nm for a deposition rate of 23.4 nm/s.

Example 4

A gas mixture of 0.29% $Et_2Zn.TEEDA$ in 12 slpm of nitrogen carrier gas was fed into the primary feed tube at a temperature of 160° C. In the secondary feed tube, a gas mixture of 1.16 mol % water in 3 slpm nitrogen was fed at a temperature of 160° C. The secondary nozzle was inserted to allow for a mixing zone length of 18 cm, corresponding to a mixing time of ~76 msec between the primary and secondary feed streams. The substrate used for deposition was borosilicate float glass with a thickness of 1.1 mm. The substrate was heated on a resistively heated nickel block set at 525° C. The substrate temperature was recorded as 500° C. by an infrared pyrometer. The deposition time for the films was 20 seconds, and the film thickness was 502 nm for a deposition rate of 25.1 nm/s.

Example 5

A gas mixture of 0.29% $Et_2Zn.TEEDA$ in 12 slpm of nitrogen carrier gas was fed into the primary feed tube at a temperature of 160° C. In the secondary feed tube, a gas mixture of 4.65 mol % water in 3 slpm nitrogen was fed at a temperature of 160° C. The secondary nozzle was inserted to allow for a mixing zone length of 18 cm, corresponding to a mixing time of ~76 msec between the primary and secondary feed streams. The substrate used for deposition was borosilicate float glass with a thickness of 1.1 mm. The substrate was heated on a resistively heated nickel block set at 525° C. The substrate temperature was recorded as 500° C. by an infrared pyrometer. The deposition time for the films was 20 seconds, and the film thickness was 549 nm for a deposition rate of 27.4 nm/s.

Example 6

A gas mixture of 0.29% $Et_2Zn.TEEDA$ in 12 slpm of nitrogen carrier gas was fed into the primary feed tube at a temperature of 160° C. In the secondary feed tube a gas mixture of 6.92 mol % water in 3 slpm nitrogen was fed at a temperature of 160° C. The secondary nozzle was inserted to allow for a mixing zone length of 18 cm, corresponding to a mixing time of ~76 msec between the primary and secondary feed streams. The substrate used for deposition was borosilicate float glass with a thickness of 1.1 mm. The substrate was heated on a resistively heated nickel block set at 525° C. The substrate temperature was recorded as 500° C. by an infrared pyrometer. The deposition time for the films was 20 seconds, and the film thickness was 581 nm for a deposition rate of 29 nm/s.

Example 7

A gas mixture of 0.29% $Et_2Zn.TEEDA$ in 12 slpm of nitrogen carrier gas was fed into the primary feed tube at a temperature of 160° C. In the secondary feed tube, a gas mixture of 13.84 mol % water in 3 sLpm nitrogen was fed at a temperature of 160° C. The secondary nozzle was inserted to allow for a mixing zone length of 18 cm, corresponding to a mixing time of ~76 msec between the primary and secondary feed streams. The substrate used for deposition was borosilicate float glass with a thickness of 1.1 mm. The substrate was heated on a resistively heated nickel block set at 525° C. The substrate temperature was recorded as 500° C. by an infrared pyrometer. The deposition time for the films was 20 seconds, and the film thickness was 588 nm for a deposition rate of 29.4 nm/s.

As will be noted, the gas mixture of Comparative Example 1 utilizes 0.60 mol % of ultra high purity $O_2$ in nitrogen carrier gas to react with diethylzinc.TEEDA. In order to achieve a ZnO film thickness of 297 nm, a deposition time of 500 seconds was necessary. Thus, a film growth rate of only 0.6 nm/sec was observed.

In Example 1, water was substituted for $O_2$ in accordance with the method of the invention. A deposition time of 60 seconds produced a film thickness of 531 nm, or a growth rate of slightly less than 9 nm/sec.

The gas mixture of Example 2 contained a substantially higher proportion of water than Example 1 in accordance with the method of the invention (8.30 mol % v. 6.92 mol %); a higher mol % of zinc precursor was also used in Example 2 than in Comparative Example 1 and Example 1 in accordance with the method of the invention (0.034 mol % v. 0.096 mol %). In only 3 seconds, with the above-noted proportions of constituents in the gas mixture of Example 2, a ZnO film having a thickness of 287 nm was deposited. This represents a growth rate of approximately 95.7 nm/s. The films of Example 2 were hazier than those of Example 1.

In Comparative Example 2, the effect of the length of the precursor mixing zone and the precursor mixing (resident) time being increased is highlighted. In this example, resident time in the mixing zone is substantially increased resulting in no film being formed, as chemical pre-reaction is believed to have occurred.

Examples 3 and 4 in accordance with the method of the invention show that even at deposition temperatures at the lower end of the preferred range for operation of the present invention, and with lower precursor concentrations, good quality zinc oxide films can be produced at commercially viable rates.

Example 5, which is quite similar to Examples 3 and 4, but for a higher water content, again shows the beneficial effects of water on film deposition rate.

Similarly, Examples 6 and 7 show the effects of greatly increased proportions of water on film thickness and growth rate.

Clearly, the utilization of $H_2O$ at a relatively high proportion of the gas mixture reacts quickly and efficiently with suitable zinc precursor materials to produce zinc oxide films at commercially useful rates.

While this invention has been described with respect to various specific examples and embodiments, it is to be understood that the invention is not limited thereto, and that it can be variously practiced within the scope of the following claims.

What is claimed is:

1. A chemical vapor deposition process for depositing a zinc oxide coating on a moving substrate comprising:
    (a) forming a first precursor gas stream comprised of a zinc containing compound;
    (b) forming a second precursor gas stream comprised of water;
    (c) delivering said first and said second precursor gas streams to a gas mixing chamber a predetermined distance above a surface of a glass substrate to be coated, which glass substrate is outside of the gas mixing chamber and at atmospheric pressure; and
    (d) mixing together said first precursor gas stream and said second precursor gas stream in the gas mixing chamber to form a precursor mixture and then upon exiting the gas mixing chamber, contacting the surface of the substrate with said precursor mixture as it moves past the gas mixing chamber, the surface being at a temperature sufficient to drive a reaction between said zinc containing compound and said water;
    wherein said first precursor gas stream and said second precursor gas stream are mixed together in the gas mixing chamber for a time <1 sec. before the precursor mixture contacts the surface of the substrate so that a zinc oxide coating is formed on the surface at a deposition rate of greater than 5 nm/second.

2. The method defined in claim 1, wherein the glass substrate is heated to a temperature $\geq 400°$ C.

3. The method defined in claim 2, wherein the glass substrate is heated to a temperature between 500° C. and 700° C.

4. The method defined in claim 1, wherein the zinc containing compound has the formula $R^1R^2Zn$ or $R^1R^2Zn-[R^3R^4N(CHR^5)_n(CH_2)_m(CHR^6)_nNR^7R^8]$, where $R^{1-8}$ can be the same or different alkyl or aryl groups such as methyl, ethyl, isopropyl, n-propyl, n-butyl, sec-butyl, phenyl or substituted phenyl, and may include one or more fluorine-containing substituents, $R^5$ and $R^6$ can be H or alkyl or aryl groups, n can be 0 or 1, and m can be 1-6 if n is 0, and m can be 0-6 if n is 1.

5. The method defined in claim 1, wherein the zinc containing compound and water are mixed in the gas mixing chamber for a time <0.5 sec.

6. The method defined in claim 5, wherein the zinc containing compound and water are mixed in the gas mixing chamber for a time between 70 msec. and 100 msec.

7. The method defined in claim 1, wherein the zinc oxide coating deposition rate is greater than 20 nm/second.

8. The method defined in claim 1, wherein the mol % of the precursor gas mixture is between 3 mol % and 14 mol %.

9. The method defined in claim 4, wherein the zinc-containing compound comprises one chosen from the group consisting of: $Me_2Zn$ or $Me_2Zn.TMPDA$ [TMPDA=N,N,N',N'-tetramethyl-1,3-propanediamine] or $Me_2Zn.TEEDA$ [TEEDA=N,N,N',N'-tetraethyl ethylenediamine] or -$Me_2Zn$-TMEDA [TMEDA=N,N,N',N'-tetramethyl ethylenediamine] or $Et_2Zn$ or $Et_2Zn.TEEDA$ or $Et_2Zn$-TMPDA or $Et_2Zn$-TMEDA 10. The method defined in claim 1, wherein the second precursor gas stream is comprised of an alcohol containing a predetermined amount of water.

11. The method defined in claim 10, wherein the alcohol is 2-butanol and the predetermined amount of water is between 1 mol % and 10 mol %.

* * * * *